(12) United States Patent
Nayak et al.

(10) Patent No.: US 9,790,587 B2
(45) Date of Patent: Oct. 17, 2017

(54) ARTICLE AND METHOD OF MAKING THEREOF

(71) Applicant: General Electric Company, Schenectady, NY (US)

(72) Inventors: Mohandas Nayak, Bangalore (IN); Shankar Sivaramakrishnan, Schenectady, NY (US); Venkat Subramaniam Venkataramani, Clifton Park, NY (US); Alok Mani Srivastava, Niskayuna, NY (US); Shahana Chatterjee, Bangalore (IN)

(73) Assignee: General Electric Company, Niskayuna, NY (US)

(*) Notice: Subject to any disclaimer, the term of this patent is extended or adjusted under 35 U.S.C. 154(b) by 106 days.

(21) Appl. No.: 14/525,586

(22) Filed: Oct. 28, 2014

(65) Prior Publication Data

US 2016/0115819 A1 Apr. 28, 2016

(51) Int. Cl.
*F01D 25/00* (2006.01)
*F01D 5/28* (2006.01)
(Continued)

(52) U.S. Cl.
CPC ............ *C23C 14/08* (2013.01); *C04B 35/00* (2013.01); *C23C 4/126* (2016.01); *C23C 4/129* (2016.01); *C23C 4/131* (2016.01); *C23C 4/134* (2016.01); *C23C 28/042* (2013.01); *C23C 28/3215* (2013.01); *C23C 28/3455* (2013.01); *F01D 5/288* (2013.01); *F05D 2230/31* (2013.01); *F05D 2230/90* (2013.01);
(Continued)

(58) Field of Classification Search
None
See application file for complete search history.

(56) References Cited

U.S. PATENT DOCUMENTS 5,871,820 A 2/1999 Hasz et al.
6,117,560 A 9/2000 Maloney
(Continued)

FOREIGN PATENT DOCUMENTS

JP 2006298695 A * 11/2006

OTHER PUBLICATIONS

JP2006-298695_MT Nov. 2, 2006.*
(Continued)

*Primary Examiner* — Vera Katz
(74) *Attorney, Agent, or Firm* — Nitin N. Joshi

(57) ABSTRACT

An article including a substrate and a plurality of coatings disposed on the substrate is presented. The plurality of coatings includes a thermal barrier coating disposed on the substrate; and a protective coating including a calcium-magnesium-aluminum-silicon-oxide (CMAS)-reactive material disposed on the thermal barrier coating. The CMAS-reactive material has an orthorhombic weberite crystal structure. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition. A method of making the article and a related turbine engine component are also presented.

11 Claims, 7 Drawing Sheets

(51) Int. Cl.

| | |
|---|---|
| *C23C 14/08* | (2006.01) |
| *C23C 14/22* | (2006.01) |
| *C23C 4/12* | (2016.01) |
| *C04B 35/00* | (2006.01) |
| *C23C 28/04* | (2006.01) |
| *C23C 28/00* | (2006.01) |
| *C23C 4/131* | (2016.01) |
| *C23C 4/129* | (2016.01) |
| *C23C 4/126* | (2016.01) |
| *C23C 4/134* | (2016.01) |

(52) U.S. Cl.
CPC .... *F05D 2300/15* (2013.01); *F05D 2300/211* (2013.01); *F05D 2300/2112* (2013.01); *Y02T 50/671* (2013.01)

(56) References Cited

U.S. PATENT DOCUMENTS

| | | |
|---|---|---|
| 6,177,200 B1 | 1/2001 | Maloney |
| 6,589,677 B1 | 7/2003 | Sun et al. |
| 6,924,040 B2 | 8/2005 | Maloney |
| 6,933,066 B2 | 8/2005 | Nagaraj et al. |
| 7,208,232 B1 | 4/2007 | Gorman et al. |
| 7,354,651 B2 | 4/2008 | Hazel et al. |
| 7,442,444 B2 | 10/2008 | Hazel et al. |
| 7,527,877 B2 | 5/2009 | Gorman et al. |
| 7,622,411 B2 | 11/2009 | Akiyama et al. |
| 7,662,489 B2 | 2/2010 | Litton et al. |
| 7,722,959 B2 | 5/2010 | Schlichting et al. |
| 8,062,759 B2 | 11/2011 | Fu et al. |
| 8,080,283 B2 | 12/2011 | Schlichting et al. |
| 8,216,977 B2 | 7/2012 | Harrington et al. |
| 2005/0129869 A1 | 6/2005 | Ackerman et al. |
| 2007/0151481 A1* | 7/2007 | Akiyama ............... C04B 35/01 106/286.2 |
| 2008/0124479 A1 | 5/2008 | Hazel et al. |
| 2010/0242797 A1* | 9/2010 | Nagano ............... C04B 35/495 106/286.2 |
| 2010/0291302 A1 | 11/2010 | Ackerman et al. |
| 2014/0272467 A1 | 9/2014 | Schaeffer et al. |
| 2016/0168684 A1* | 6/2016 | Brosnan ............... C23C 4/127 428/305.5 |

OTHER PUBLICATIONS

Wakeshima et al., "Crystal structures and magnetic properties of rare earth tantalates RE3TaO7(RE=rare earths)", Journal of Physics Condensed Matter, 16 (2004) 4103-4120, 19 Pages.

Cai et al., "Complex ceramic Structures.I.Weberites", Acta Crystallographica Structural Science Section B, 2009, B 65, vol. 63, part 3, pp. 269-290.

Dai et al., "Preparation of Ultra-Fine La3NbO7 Powder by Solid State Reaction", Key Engineering Materials, www.scientific.net, Jun. 2012, vol. 512-515, pp. 158-161.

* cited by examiner

ARTICLE AND METHOD OF MAKING THEREOF

BACKGROUND OF THE INVENTION

The invention relates generally to articles including protective coatings for thermal barrier coatings. More particularly, the invention relates to articles including protective coatings for thermal barrier coatings, such that the protective coatings are calcium-magnesium-aluminum-silicon-oxide (CMAS)-reactive.

Thermal barrier coatings are typically used in articles that operate at or are exposed to high temperatures. Aviation turbines and land-based turbines, for example, may include one or more components protected by the thermal barrier coatings. Under normal conditions of operation, thermal-barrier coated components may be susceptible to various types of damage, including erosion, oxidation, and attack from environmental contaminants.

For turbine components, environmental contaminant compositions of particular concern are those containing oxides of calcium, magnesium, aluminum, silicon, and mixtures thereof. These oxides combine to form contaminant compositions comprising mixed calcium-magnesium-aluminum-silicon-oxide systems (Ca—Mg—Al—SiO), hereafter referred to as "CMAS." At the high turbine operating temperatures, these environmental contaminants can adhere to the heated or hot thermal barrier coating surface, and thus cause damage to the thermal barrier coating. For example, CMAS can form compositions that are liquid or molten at the operating temperatures of the turbines. The molten CMAS composition can dissolve the thermal barrier coating, or can infiltrate its porous structure by infiltrating the pores, channels or other cavities in the coating. Upon cooling, the infiltrated CMAS composition solidifies and reduces the coating strain tolerance, thus initiating and propagating cracks that may cause delamination and spalling of the coating material. This may further result in partial or complete loss of the thermal protection provided to the underlying metal substrate of the part or component. Further, spallation of the thermal barrier coating may create hot spots in the metal substrate leading to premature component failure. Premature component failure can lead to unscheduled maintenance as well as parts replacement resulting in reduced performance, and increased operating and servicing costs.

Thus, there is a need for improved coating systems that provide protection to thermal barrier coatings from the adverse effects of environmental contaminants, when operated at or exposed to high temperatures. In particular, there is a need for improved coating systems that provide protection to thermal barrier coatings from the adverse effects of deposited CMAS.

BRIEF DESCRIPTION OF THE INVENTION

One embodiment is directed to an article including a substrate and a plurality of coatings disposed on the substrate. The plurality of coatings includes a thermal barrier coating disposed on the substrate; and a protective coating including a calcium-magnesium-aluminum-silicon-oxide (CMAS)-reactive material disposed on the thermal barrier coating. The CMAS-reactive material has an orthorhombic weberite crystal structure. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

Another embodiment of the invention is directed to an article including a substrate and a plurality of coatings disposed on the substrate. The plurality of coatings includes a thermal barrier coating disposed on the substrate; and a protective coating disposed on the thermal barrier coating. The protective coating includes an orthorhombic weberite oxide compound including gadolinium, oxygen, and at least one element selected from the group consisting of tantalum and niobium.

Another embodiment of the invention is directed to a method of manufacturing an article. The method includes forming a plurality of coatings by disposing a thermal barrier coating on a substrate; and disposing a protective coating including a calcium-magnesium-aluminum-silicon-oxide (CMAS)-reactive material on the thermal barrier coating. The CMAS-reactive material has an orthorhombic weberite crystal structure. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

DRAWINGS

These and other features, aspects, and advantages of the present invention will become better understood when the following detailed description is read with reference to the accompanying drawings, in which like characters represent like parts throughout the drawings, wherein.

DETAILED DESCRIPTION

Figure 1:
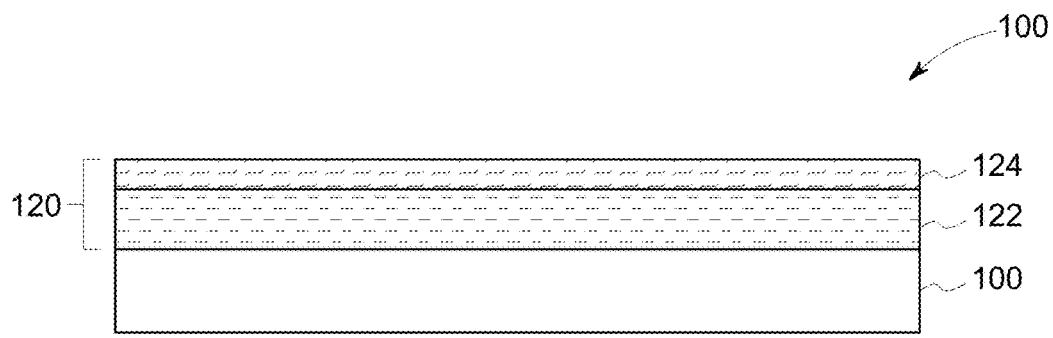
FIG. 1 illustrates a schematic of an article in accordance with an embodiment of the invention.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

As used herein, the term "coating" refers to a material disposed on at least a portion of an underlying surface in a continuous or discontinuous manner. Further, the term "coating" does not necessarily mean a uniform thickness of the disposed material, and the disposed material may have a uniform or a variable thickness. The term "coating" may refer to a single layer of the coating material or may refer to a plurality of layers of the coating material. The coating material may be the same or different in the plurality of layers.

As used herein, the term "disposed on" refers to layers or coatings disposed directly in contact with each other or indirectly by having intervening layers there between, unless otherwise specifically indicated. The term "adjacent" as used herein means that the two layers or coatings are disposed contiguously and are in direct contact with each other.

As mentioned earlier, thermal barrier coatings are susceptible to molten CMAS compositions at high turbine operating temperatures. The molten CMAS composition can dissolve the thermal barrier coating, or can infiltrate its porous structure by infiltrating the pores, channels or other cavities in the coating. Upon cooling, the infiltrated CMAS composition solidifies and reduces the coating strain tolerance, thus initiating and propagating cracks that may cause delamination and spalling of the coating material. Previous methods to protect the thermal barrier coatings include use of CMAS-reactive or CMAS-resistant thermal barrier coating compositions. However, the previously known CMAS-reactive compositions may not provide the desired CMAS-reactivity.

Embodiments of the invention described herein address the noted shortcomings of the state of the art. Some embodiments present an article including a substrate and a plurality of coatings disposed on the substrate. The plurality of coatings includes a thermal barrier coating disposed on the substrate; and a protective coating including a calcium-magnesium-aluminum-silicon-oxide (CMAS)-reactive material disposed on the thermal barrier coating. The CMAS-reactive material has an orthorhombic weberite crystal structure. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

In accordance with some of the embodiments of the invention, the protective coating may protect the thermal barrier coating by undergoing one or both of chemical and physical changes when in contact with a CMAS composition. The protective coating may be disposed on the thermal barrier coating such that the protective coating overlies the thermal barrier coating. In certain embodiments, the overlay protective coating is disposed adjacent to the thermal barrier coating.

The term "CMAS" or "CMAS composition" as used herein refers to a contaminant composition including calcium, magnesium, aluminum and silicon. In some embodiments, the CMAS composition primarily includes a mixture of magnesium oxide, calcium oxide, aluminum oxide and silicon oxide. Non-limiting example of a suitable CMAS composition includes calcium oxide present in an amount in a range from about 1 wt % to about 60 wt % of the total CMAS composition; magnesium oxide present in an amount in a range from about 0 wt % to about 20 wt % of the total CMAS composition; aluminum oxide present in an amount in a range from about 10 wt % to about 30 wt % of the total CMAS composition; and silicon oxide present in an amount in a range from about 20 wt % to about 80 wt % of the total CMAS composition.

In some embodiments, other elements, such as nickel, iron, titanium and chromium, may also be present in the CMAS composition. In such instances, the additional elements may be present in a small amount, for example, less than about 10 weight percent of total amount of CMAS composition present. In some such instances, the CMAS composition may include about 29 wt % calcium oxide, about 7 wt % magnesium oxide, about 11 wt % aluminum oxide, and about 43 wt % silicon oxide. Further, the composition may include about 2 wt % nickel oxide, about 8 wt % iron oxide, and small amounts of titanium oxide and chromium oxide, such that the total weight percentage of these elements is less than 10 wt %. The CMAS composition may have a melting temperature less than about 1315° C. (2399° F.) in some embodiments, and less than about 1227° C. (2240° F.) in some other embodiments.

The particular compositional characteristics of the CMAS composition may depend on the source of the environmental contaminants and the reaction temperature. The CMAS composition is typically formed at operational temperatures of about 1000° C. (1832° F.) or more. Sources of CMAS composition include, but are not limited to, sand, dirt, volcanic ash, fly ash, cement, runway dirt, fuel and air sources, oxidation and wear products from engine components, or combinations thereof.

As used herein, the term "CMAS-reactive material" refers to a material capable of reacting with a CMAS composition to form a reaction product having one or both of melting temperature and viscosity greater than that of the CMAS composition. In some instances, the reaction product may form a glassy (typically thin) protective layer that the CMAS deposits are either unable to adhere to, or are less able to adhere to.

In accordance with embodiments of the invention, a suitable CMAS-reactive material has an orthorhombic weberite crystal structure. The weberite structure is an anion-deficient fluorite-related superstructure. Compared with fluorites, the reduction in the number of anions leads to a decrease in the coordination number of the B cations (VI coordination) with respect to the A cations (VIII coordination), thus allowing the accommodation of diverse cations. The term "orthorhombic weberite crystal structure" as used herein refers to crystal structure of a family of materials with the general formulation $A_2B_2X_7$ or $A_3BX_7$, wherein A is a rare earth metal ion, B is tantalum (Ta) and/or niobium (Nb), and X is oxygen or fluorine. Further details of the structure have been described in "Complex Ceramic Structures I Weberites", Cai et al., *Acta Crystallographica*. Part B, Vol. 63, Part 3, 2009. While several other compounds possess the same stoichiometry (pyrochlores, layered perovskites etc.), the weberite compounds are isomorphous to the fluoride mineral $Na_2MgAlF_7$.

In some embodiments, CMAS-reactive material includes an oxide including a rare earth metal, oxygen, and an element selected from the group consisting of tantalum and niobium. Non-limiting examples of suitable rare earth metals include scandium, yttrium, lanthanum, cerium, gadolinium, praseodymium, neodymium, promethium, samarium, europium, terbium, dysprosium, holmium, erbium, thulium, ytterbium, lutetium, or combinations thereof.

In some embodiments, the CMAS-reactive material includes an oxide having a formula:

$$A_3BO_7$$

wherein A is a rare earth metal; and B is niobium or tantalum. In certain embodiments, A includes lanthanum, yttrium, cerium, neodymium, gadolinium, dysprosium, praseodymium, lutetium, or combinations thereof.

Non-limiting examples of suitable orthorhombic weberite oxide compounds include $Gd_3TaO_7$, $Gd_3NbO_7$, $Nd_3NbO_7$, $La_3TaO_7$, $La_3NbO_7$, $Dy_3TaO_7$, $Pr_3TaO_7$, $Pr_3NbO_7$, or combinations thereof. In some embodiments, the CMAS-reactive material may include a mixture of two or more of the weberite oxide compositions. For example, the CMAS-reactive material may include either $La_3TaO_7$ or $La_3NbO_7$ along with one or more of other weberite oxide compositions. In certain embodiments, the CMAS-reactive material may include either $Gd_3TaO_7$ or $Gd_3NbO_7$ along with one or more of other weberite oxide compositions.

In some embodiments, the CMAS-reactive material includes an orthorhombic weberite oxide compound including gadolinium, oxygen, and at least one element selected from the group consisting of tantalum and niobium. In some embodiments, the orthorhombic weberite oxide compound has a formula $Gd_{3-x}Ta_{1-x}[O_aY_b]$; wherein x is a number in a range from about −0.2 to about 0.2, a is a number in a range from about 0.5 to about 1, b is a number in a range from about 0.3 to about 2, and Y is nitrogen or fluorine. In some embodiments, the orthorhombic weberite oxide compound has a formula $Gd_{3-x}Nb_{1-x}[O_aY_b]$; wherein x is a number in a range from about −0.2 to about 0.2, a is a number in a range from about 0.5 to about 1, b is a number in a range from about 0.3 to about 2, and Y is nitrogen or fluorine. Non-limiting examples of suitable orthorhombic weberite oxide compounds include $Gd_3TaO_7$, $Gd_3NbO_7$, or combinations thereof. It should be noted that the orthorhombic weberite oxide compounds may further allow for variations in anion content due to defects.

As noted earlier, the CMAS-reactive material is present in the plurality of coatings in an effective amount to react with the CMAS composition at an operating temperature of the thermal barrier coating, thereby forming a reaction product having one or both of melting temperature and viscosity greater than that of the CMAS composition.

The term "effective amount" as used herein refers to an amount (for example, volume) of the CMAS-reactive material sufficient to effectively increase one or both of the melting temperature and viscosity of the reaction product formed.

The term "operating temperature" of the thermal barrier coating refers to the temperature that the thermal barrier coating is exposed to in the turbine. In some embodiments, the operating temperature of the thermal barrier coating refers to the surface temperature of the thermal barrier coating. The term "reaction product" as used herein refers to a product or a mixture of products formed by reacting the CMAS-reactive material with the CMAS composition. In certain embodiments, the reaction product may include a mixture of products. Accordingly the terms "reaction product" and "reaction product mixture" are used herein interchangeably. In some such instances, one or more products in the reaction product mixture may include new crystal phases that have a melting temperature greater than that of the CMAS composition. Further, in some such instances, the reaction product mixture may have a viscosity greater than that of the CMAS composition.

In some embodiments, the CMAS-reactive material is present in the plurality of coatings in an amount such that the melting temperature of the reaction product is increased at least to the surface temperature of the thermal barrier coating. In some embodiments, the CMAS-reactive material is present in the plurality of coatings in an amount such that the melting temperature of the reaction product increases by at least about 10° C. above the surface temperature of the thermal barrier coating during its operation. In some embodiments, the CMAS-reactive material is present in the plurality of coatings in an amount such that the melting temperature of the reaction product increases by about 40° C. to about 100° C. above the surface temperature of the thermal barrier coating during its operation. Thus, by way of an example, if the surface temperature of the thermal barrier coating during operation is about 1230° C., then the CMAS-reactive material is present in amount such that the melting temperature of the reaction product increases to at least about 1240° C.

In some embodiments, the CMAS-reactive material is present in the plurality of coatings in an amount such that the viscosity of the reaction product increases by at least about 10 centipoise above the viscosity of the CMAS composition, at the operating temperature of the thermal barrier coating. In some embodiments, the CMAS-reactive material is present in the plurality of coatings in an amount such that the viscosity of the reaction product increases by about 10 centipoise to about 1000000 centipoise above the viscosity of the CMAS composition, at the operating temperature of the thermal barrier coating.

In some embodiments, the CMAS-reactive material is present in the plurality of coatings in an amount in a range from about 10 volume percent to about 75 volume percent. In some embodiments, the CMAS-reactive material is present in the plurality of coatings in an amount in a range from about 10 volume percent to about 50 volume percent. In some embodiments, the CMAS-reactive material is present in the plurality of coatings in an amount in a range from about 10 volume percent to about 25 volume percent.

The protective coating may be further characterized by the thickness, and may have a thickness such that the effective amount of the CMAS-reactive material is present in the plurality of coatings. In some embodiments, the protective coating has a thickness in a range from about 10 microns to about 1000 microns. In some embodiments, the protective coating has a thickness in a range from about 25 microns to about 500 microns. In some embodiments, the protective coating has a thickness in a range from about 50 microns to about 100 microns.

The protective coating may include the CMAS-reactive material in an amount of up to 100 wt %, and sufficient to protect the thermal barrier coating at least partially against deposited CMAS. In some embodiments, the protective coating consists essentially of the CMAS-reactive material. The term "consists essentially" as used herein means that the protective coating includes less than 10 volume percent of material other than the CMAS-reactive material that may alter the properties of the protective coating (for example, CTE). In certain embodiments, the protective coating includes less than about 10 volume percent of the thermal barrier coating material (for example, ceramic thermal barrier coating material).

As used herein, the term "thermal barrier coating" refers to a coating include a material capable of reducing heat flow to the underlying substrate of the article, that is, forming a thermal barrier. In some embodiments, the thermal barrier coating includes a material having a melting point greater than about 1090° C. In some embodiments, the thermal barrier coating includes a material having a melting point greater than about 1200° C. In some embodiments, the thermal barrier coating includes a material having a melting point in a range from about 1200° C. to about 1930° C.

In some embodiments, the thermal barrier coating includes a ceramic thermal barrier material. Suitable ceramic thermal barrier coating materials include various zirconias, in particular chemically stabilized zirconias (for example, metal oxides blended with zirconia), such as yttria-stabilized zirconias, ceria-stabilized zirconias, calcia-stabilized zirconias, scandia-stabilized zirconias, magnesia-stabilized zirconias, india-stabilized zirconias, ytterbia-stabilized zirconias, lanthana-stabilized zirconias, gadolinia-stabilized zirconias, as well as mixtures of such stabilized zirconias.

In certain embodiments, the thermal barrier coating includes yttria-stabilized zirconias. Suitable yttria-stabilized zirconias may include from about 1 wt % to about 20 wt % yttria (based on the combined weight of yttria and zirconia), and more typically from about 3 wt % to about 10 wt % yttria. An example yttria-stabilized zirconia thermal barrier coating includes about 7% yttria and about 93% zirconia. These chemically stabilized zirconias may further include one or more of a second metal (e.g., a lanthanide or actinide) oxide such as dysprosia, erbia, europia, gadolinia, neodymia, praseodymia, urania, and hafnia to further reduce thermal conductivity of the thermal barrier coating. In some embodiments, the thermal barrier coating may further include an additional metal oxide, such as, titania.

Suitable ceramic thermal barrier coating materials may also include pyrochlores of general formula $A_2B_2O_7$ where A is a metal having a valence of 3+ or 2+ (e.g., gadolinium, aluminum, cerium, lanthanum or yttrium) and B is a metal having a valence of 4+ or 5+ (e.g., hafnium, titanium, cerium or zirconium) where the sum of the A and B valences is 7. Representative materials of this type include gadolinium-zirconate, lanthanum titanate, lanthanum zirconate, yttrium zirconate, lanthanum hafnate, cerium zirconate, aluminum cerate, cerium hafnate, aluminum hafnate and lanthanum cerate.

The thermal barrier coating may include the ceramic thermal barrier coating material in an amount of up to 100 wt %. In some embodiments, the thermal barrier coatings includes the ceramic thermal barrier coating material in a range from about 95 wt % to about 100 wt % and more particularly from about 98 wt % to about 100 wt %. The composition of the thermal barrier coating in terms of the type and amount of the ceramic thermal barrier coating materials may depend upon one or factors, including the composition of the adjacent bond coat layer (if present), the coefficient of thermal expansion (CTE) characteristics desired for the thermal barrier coating, and the thermal barrier properties desired for the thermal barrier coating.

The thickness of the thermal barrier coating may depend upon the substrate or the component it is deposited on. In some embodiments, the thermal barrier coating has a thickness in a range from about 50% to about 90% of the total thickness of the plurality of layers. In some embodiments, the thermal barrier coating has a thickness in a range of from about 25 microns to about 2000 microns. In some embodiments, the thermal barrier coating has a thickness in a range of from about 25 microns to about 1500 microns. In some embodiments, the thermal barrier coating has a thickness in a range of from about 25 microns to about 1000 microns.

As noted earlier, the thermal barrier coatings typically include pores, channels or other cavities that may be infiltrated by molten environmental contaminants, such as, CMAS. In some instances, these pores, channels, or cavities may be created by environmental damage or the normal wear and tear during operation of the thermal barrier coatings. In some instances, the pores, channels or other cavities in the thermal barrier coating surface may result due to the deposition processes. For example, thermal barrier coatings that are deposited by (air) plasma spray techniques may result in a sponge-like porous structure of open pores in at least the surface of the coating. Similarly, thermal barrier coatings that are deposited by physical (e.g., chemical) vapor deposition techniques may result in a porous structure including a series of columnar grooves, crevices or channels in at least the surface of the coating. Without being bound by any theory it is believed that the porous structure may be one of the factors that provides for strain tolerance by the thermal barrier coatings during thermal cycling. Further, the porous structure may further provide for stress reduction due to the differences between the coefficient of thermal expansion (CTE) of the coating and the CTE of the underlying bond coat layer/substrate.

Thermal barrier coating may be disposed over the aforementioned bond coat or directly onto the substrate depending upon the desired application. The type of substrate may depend in on part on the turbine component. Non-limiting examples of suitable substrates include metals, metal alloys, or combinations thereof. In certain embodiments, the substrate includes an alloy of nickel, cobalt, iron, or combinations thereof. For example, the substrate may include a high temperature, heat-resistant alloy, e.g., a superalloy. Non-limiting examples of suitable high temperature nickel-based alloys include Inconel®, Nimonic®, Rene® (e.g., Rene® 80, Rene® 95 alloys), Udimet®, or combinations thereof.

The article may further include a bond coating disposed between the substrate and the thermal barrier coating. The bond coating may be formed from a metallic oxidation-resistant material that protects the underlying substrate and enables the thermal barrier coating to more tenaciously adhere to substrate. Suitable materials for the bond coating include $M_1CrAlY$ alloy powders, where $M_1$ represents a metal such as iron, nickel, platinum or cobalt. Non-limiting examples of suitable bond coat materials include metal aluminides such as nickel aluminide, platinum aluminide, or combinations thereof. The bond coating may have a thickness in the range of from about 25 microns to about 500 microns.

In some embodiments, the protective coating may be the outermost layer (sometimes also referred to as "top coat layer") in the article. In some other embodiments, the article may further include one or more additional layers disposed on the protective coating to form the top coat layer. Non-limiting examples of suitable top-coat layers include erosion resistant layers.

Referring now to FIG. 1, an article 100 includes a substrate 110 and a plurality of coatings 120 disposed on the substrate 110. The plurality of coatings include a thermal barrier coating 122 disposed on the substrate 110, and a protective coating 124 disposed on the thermal barrier coating 122. In the embodiment illustrated in FIG. 1, the protective coating 124 overlies and is disposed adjacent to the thermal barrier coating.

Figure 2:
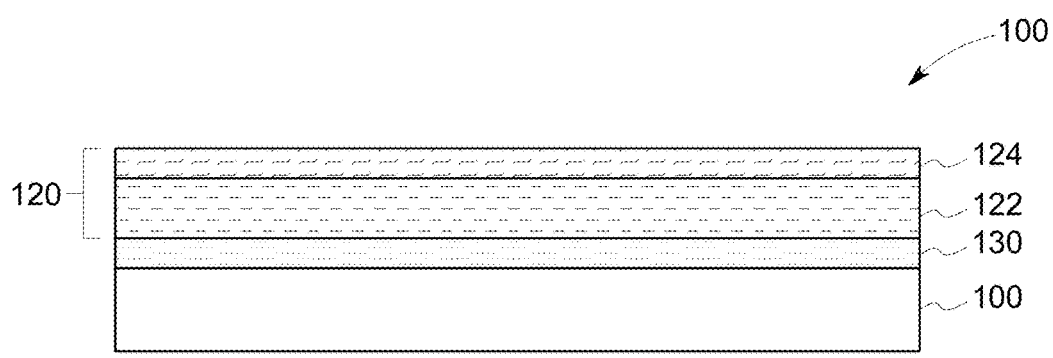
FIG. 2 illustrates a schematic of an article in accordance with an embodiment of the invention.

FIG. 2 illustrates another embodiment of the invention similar to FIG. 1, with the addition of a bond coating 130 disposed between the substrate 110 and the thermal barrier coating 122. In the embodiment illustrated in FIG. 2, the thermal barrier coating 122 overlies and is disposed adjacent to the bond coating 130.

Figure 3:
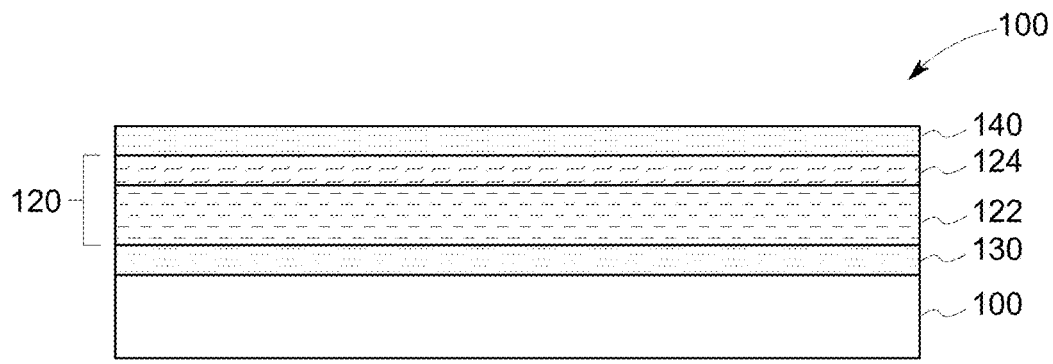
FIG. 3 illustrates a schematic of an article in accordance with an embodiment of the invention.

FIG. 3 illustrates another embodiment of the invention similar to FIG. 3, with the addition of a top-coat layer 140 disposed on the protective coating 124. As mentioned previously the top-coat layer 140 may include an erosion resistance material in some embodiments.

The coating systems of the present invention may be useful in a wide variety of turbine components (e.g., turbine engine components) that are operated at, or exposed to, high temperatures. Non-limiting examples of suitable turbine engine components include turbine airfoils such as blades and vanes, turbine shrouds, turbine nozzles, buckets, combustor components such as liners and deflectors, heat shields, augmentor hardware of gas turbine engines, and the like. The coatings systems of the present invention may be disposed over a portion or over all of the metal substrate. For example, with regard to airfoils such as blades, the coating systems of the present invention are typically used to protect, cover or overlay portions of the metal substrate of the airfoil other than solely the tip thereof, for example, the thermal barrier coatings cover the leading and trailing edges and other surfaces of the airfoil.

In some embodiments an article including a substrate; and a plurality of coatings disposed on the substrate is presented. The plurality of coatings includes a thermal barrier coating disposed on the substrate; and a protective coating disposed on the thermal barrier coating. The protective coating includes an orthorhombic weberite oxide compound including gadolinium, oxygen, and at least one element selected from the group consisting of tantalum and niobium. In some embodiments, the orthorhombic weberite oxide compound has a formula $Gd_{3-x}Ta_{1-x}[O_aY_b]$; wherein x is a number in a range from about −0.2 to about 0.2, a is a number in a range from about 0.5 to about 1, b is a number in a range from about 0.3 to about 2, and Y is nitrogen or fluorine. In some embodiments, the orthorhombic weberite oxide compound has a formula $Gd_{3-x}Nb_{1-x}[O_aY_b]$; wherein x is a number in a range from about −0.2 to about 0.2, a is a number in a range from about 0.5 to about 1, b is a number in a range from about 0.3 to about 2, and Y is nitrogen or fluorine. Non-limiting examples of suitable orthorhombic weberite oxide compounds include $Gd_3TaO_7$, $Gd_3NbO_7$, or combinations thereof. It should be noted that the orthorhombic weberite oxide compounds may further allow for variations in anion content due to defects.

In some embodiments, a method of manufacturing an article is presented. The method includes disposing a thermal barrier coating on a substrate; and disposing a protective coating including a calcium-magnesium-aluminum-silicon-oxide (CMAS)-reactive material on the thermal barrier coating. As mentioned earlier, the CMAS-reactive material has an orthorhombic weberite crystal structure, and the CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

The thermal barrier coating may be deposited or otherwise formed on a bond coating (if present) or on the substrate directly by any of a variety of conventional techniques, including vapor disposition, such as physical vapor deposition (PVD), electron beam physical vapor deposition (EBPVD); plasma spray, such as air plasma spray (APS), suspension plasma spray (SPS), and vacuum plasma spray (VPS); other thermal spray deposition methods such as high velocity oxy-fuel (HVOF) spray, detonation, or wire spray; chemical vapor deposition (CVD), sol-gel method, or combinations of two or more of the afore-mentioned techniques The particular technique used for applying, depositing or otherwise forming the thermal barrier coating may depend on one or more of the composition of the thermal barrier coating, the thickness, and the physical structure desired for the thermal barrier coating. In certain embodiments, the thermal barrier coating is disposed on the substrate using plasma spray techniques. Various types of plasma-spray techniques are well known to those skilled in the art, and may be utilized to dispose the thermal barrier coatings of the present invention.

In some embodiments, the thermal barrier coating may be disposed on the bond coating. In such instances, the bond coating may be applied, deposited or otherwise formed on the substrate by any of a variety of conventional techniques including, vapor disposition, such as physical vapor deposition (PVD), electron beam physical vapor deposition (EBPVD); plasma spray, such as air plasma spray (APS), suspension plasma spray (SPS), and vacuum plasma spray (VPS); other thermal spray deposition methods such as high velocity oxy-fuel (HVOF) spray, detonation, or wire spray; chemical vapor deposition (CVD), sol-gel method, or combinations of two or more of the afore-mentioned techniques. In some embodiments, a plasma spray technique, such as that used for the thermal barrier coating, may be employed to dispose the bond coating on the substrate.

The method further includes disposing the protective coating on the thermal barrier coating. In embodiments wherein the protective coatings primarily comprises of the CMAS-reactive material, the CMAS-reactive materials may be applied, deposited or formed on the thermal barrier coating using one or more of the afore-mentioned techniques used to dispose the thermal barrier coating. In embodiments, wherein the protective coating further includes a ceramic thermal barrier material, the CMAS-reactive material and the ceramic thermal barrier material may be co-deposited on the thermal barrier coating. In some embodiments, co-depositing may be achieved by blending, mixing or otherwise combining the CMAS-reactive material and ceramic thermal barrier coating material together (for example, as powders) to provide a mixture that is then deposited onto the thermal barrier coating. In some embodiments, co-depositing may be achieved by separately depositing onto the thermal barrier coating (e.g., as separate plasma spray streams) the respective CMAS-reactive material and ceramic thermal barrier coating material in a manner such that these materials blend, mix or otherwise combine together to form a mixture.

The method of the present invention is particularly useful in providing protection or mitigation against the adverse effects of environmental contaminant compositions for TBCs used with metal substrates of newly manufactured articles. However, the method of the present invention is also useful in providing such protection or mitigation against the adverse effects of environmental contaminant compositions for refurbished worn or damaged TBCs, or in providing TBCs having such protection or mitigation for articles that did not originally have a TBC.

According to embodiments of the invention, the thermal barrier coatings are provided with at least partial and up to complete protection and mitigation against the adverse effects of environmental contaminant compositions that can deposit on the surface of such coatings during normal turbine operation. In particular, the thermal barrier coatings of the present invention are provided with at least partial and up to complete protection or mitigation against the adverse effects of CMAS deposits on such coating surfaces. The CMAS-reactive material present in the protective coating reacts with the CMAS deposits to form a reaction product having a higher melting point that does not become molten, or alternatively has a viscosity such the molten reaction product does not flow readily at higher temperatures normally encountered during turbine engine operation. In some instances, this combined reaction product may form a glassy (typically thin) protective layer that CMAS deposits are unable or less able to adhere to. As a result, these CMAS deposits may be unable to infiltrate the normally porous surface structure of the thermal barrier coating, and thus may not cause undesired partial (or complete) delamination and spalling of the coating.

The coating systems of the present invention are also useful with worn or damaged coated (or uncoated) metal substrates of turbine engine parts and components so as to provide for these refurbished parts and components protection and mitigation against the adverse effects of environmental contaminant compositions. In addition to turbine engine parts and components, the coating system of the present invention provide useful protection for metal substrates of other articles that operate at, or are exposed, to high temperatures, as well as to environmental contaminant compositions.

EXAMPLES

Two different orthorhombic weberite oxide compounds were synthesized: $Gd_3NbO_7$ and $Gd_3TaO_7$.

Example 1

PXRD Patterns for Reaction Products of CMAS with Weberite Oxide Compounds

Figure 4:
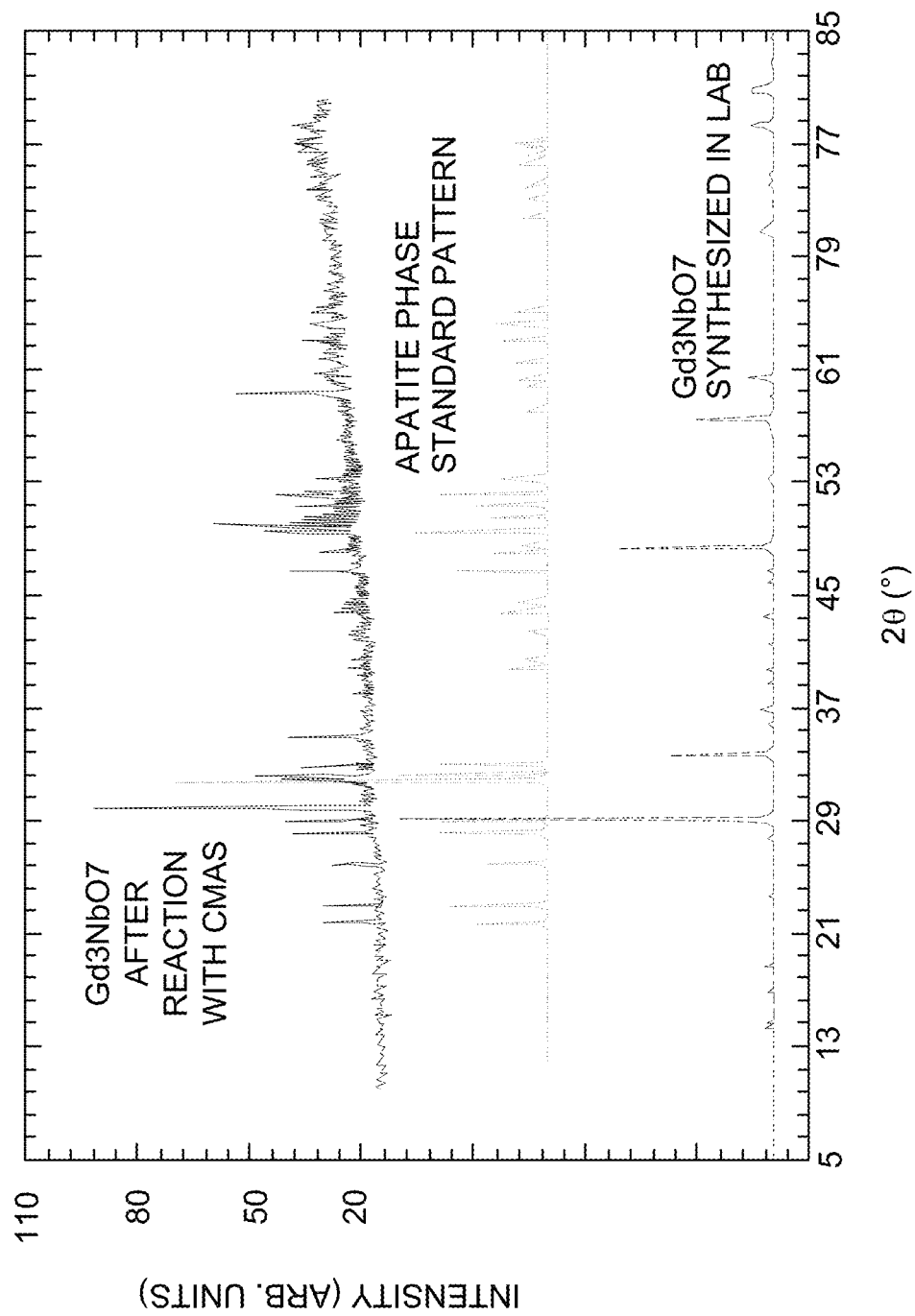
FIG. 4 shows the powder X-ray diffraction pattern for reaction products of an orthorhombic weberite oxide with CMAS in accordance with an embodiment of the invention.
Figure 5:
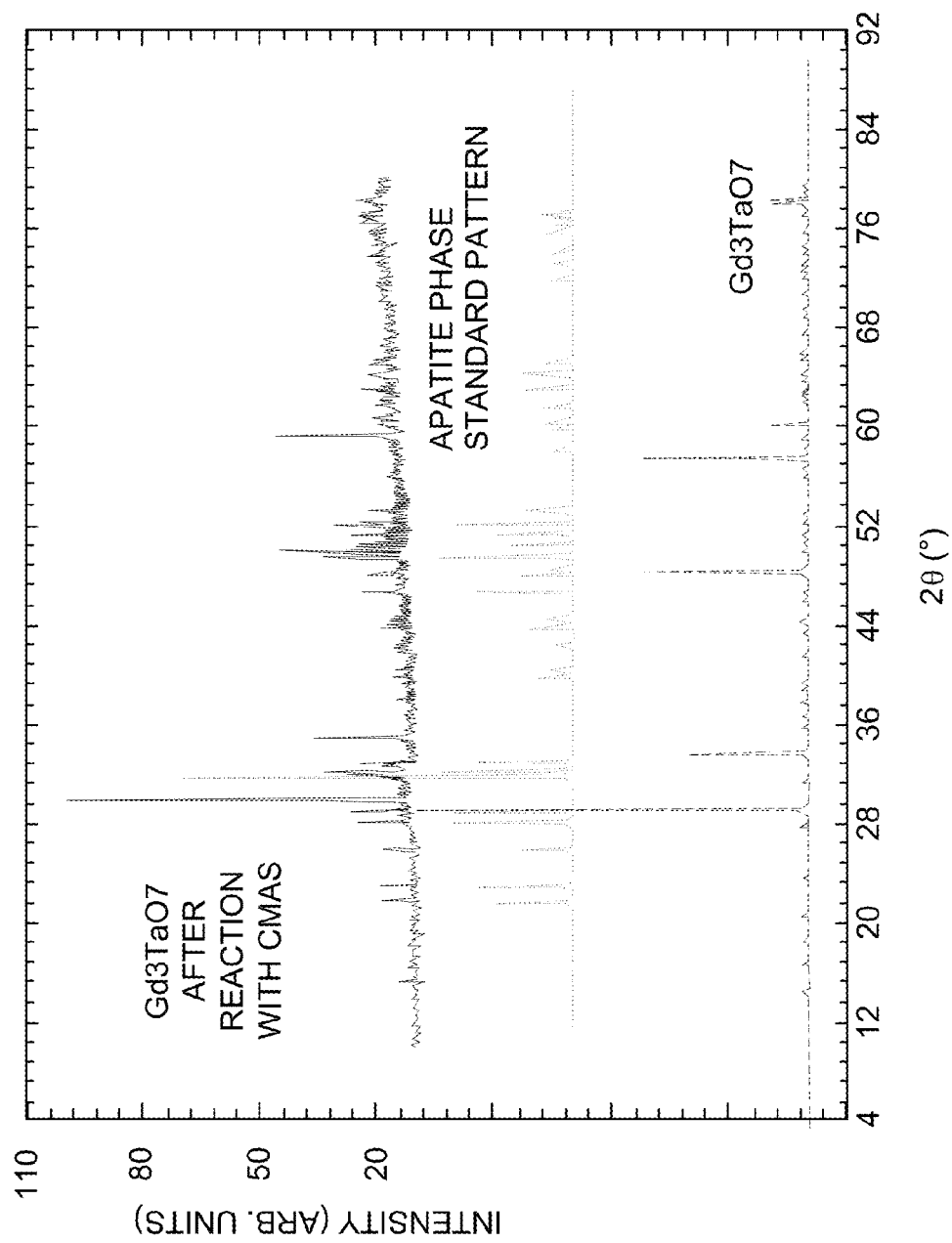
FIG. 5 shows the powder X-ray diffraction pattern for reaction products of an orthorhombic weberite oxide with CMAS in accordance with an embodiment of the invention.

Two different weberite oxide ($Gd_3NbO_7$ and $Gd_3TaO_7$) powder compositions were contacted with CMAS composition at 1400° C. for 15 minutes. The molar ratio of weberite oxides to the CMAS composition was 1:10. X-ray diffraction analysis was conducted to analyze the phases of the reaction products. Both the oxides substantially reacted completely with CMAS to form a reaction product having an apatite type structure with a nominal composition $Ca_2Gd_8(SiO_4)_6O_2$. FIGS. 4 and 5 shows the PXRD patterns for reaction products of $Gd_3NbO_7$ and $Gd_3TaO_7$ with CMAS, along with a reference pattern for $Ca_2Gd_8(SiO_4)_6O_2$.

Example 2

Figure 6:
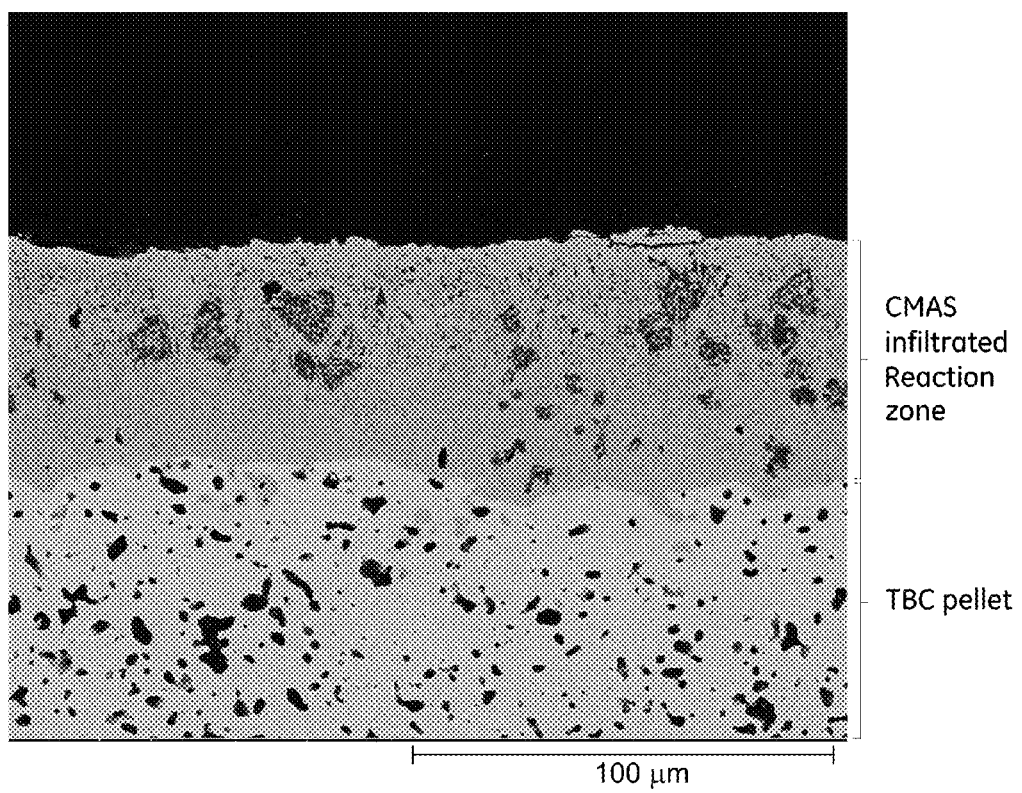
FIG. 6 shows the scanning electron micrograph images for reaction products of an orthorhombic weberite oxide with CMAS in accordance with an embodiment of the invention.
Figure 7:
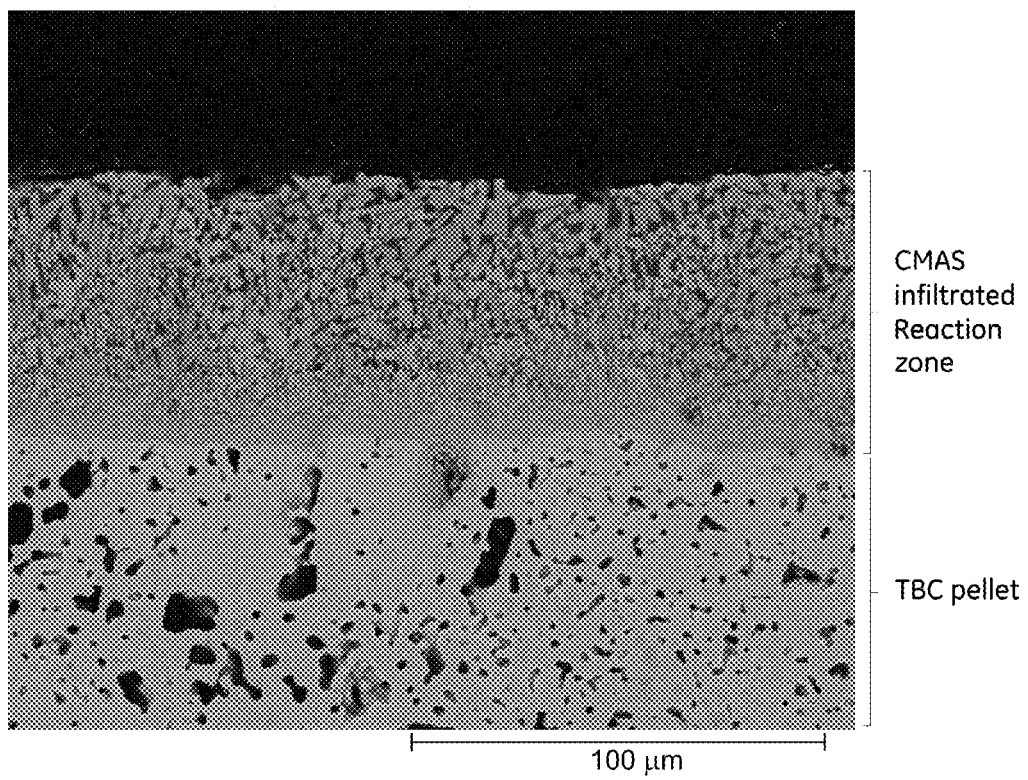
FIG. 7 shows the scanning electron micrograph images for reaction products of an orthorhombic weberite oxide with CMAS in accordance with an embodiment of the invention.

SEM Analysis of Reaction Phases and Infiltration Depths for Reaction of CMAS with Weberite Oxide Compounds Two different weberite oxide ($Gd_3NbO_7$ and $Gd_3TaO_7$) pellets were contacted with CMAS by placing low dose CMAS tapes (8 mg/cm$^2$) of approximate dimension 5×5 mm on the surface of the pellets. The weberite oxides and CMAS tapes were heat treated at 1400° C. for 15 minutes. The molar ratio of weberite oxides to the CMAS composition was 1:10. Cross-section scanning electron micrograph (SEM) images of reaction products were observed to analyze the infiltration pattern of CMAS into the weberite oxide pellets. FIGS. 6 and 7 show that the weberite oxide compounds react and reduces the amount of CMAS. Further, formation of second phases (needle like) is seen in the cross section.

Example 3

Figure 8:
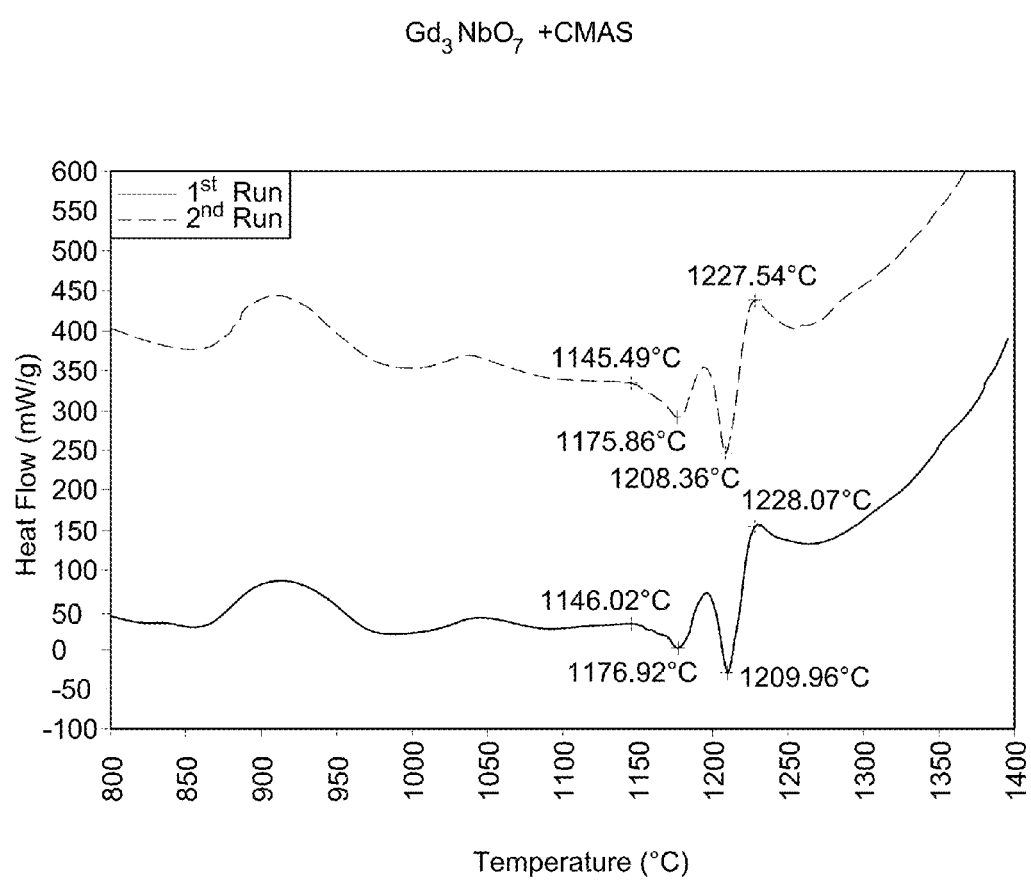
FIG. 8 shows the differential scanning calorimetry scans for reaction products of an orthorhombic weberite oxide with CMAS in accordance with an embodiment of the invention.
Figure 9:
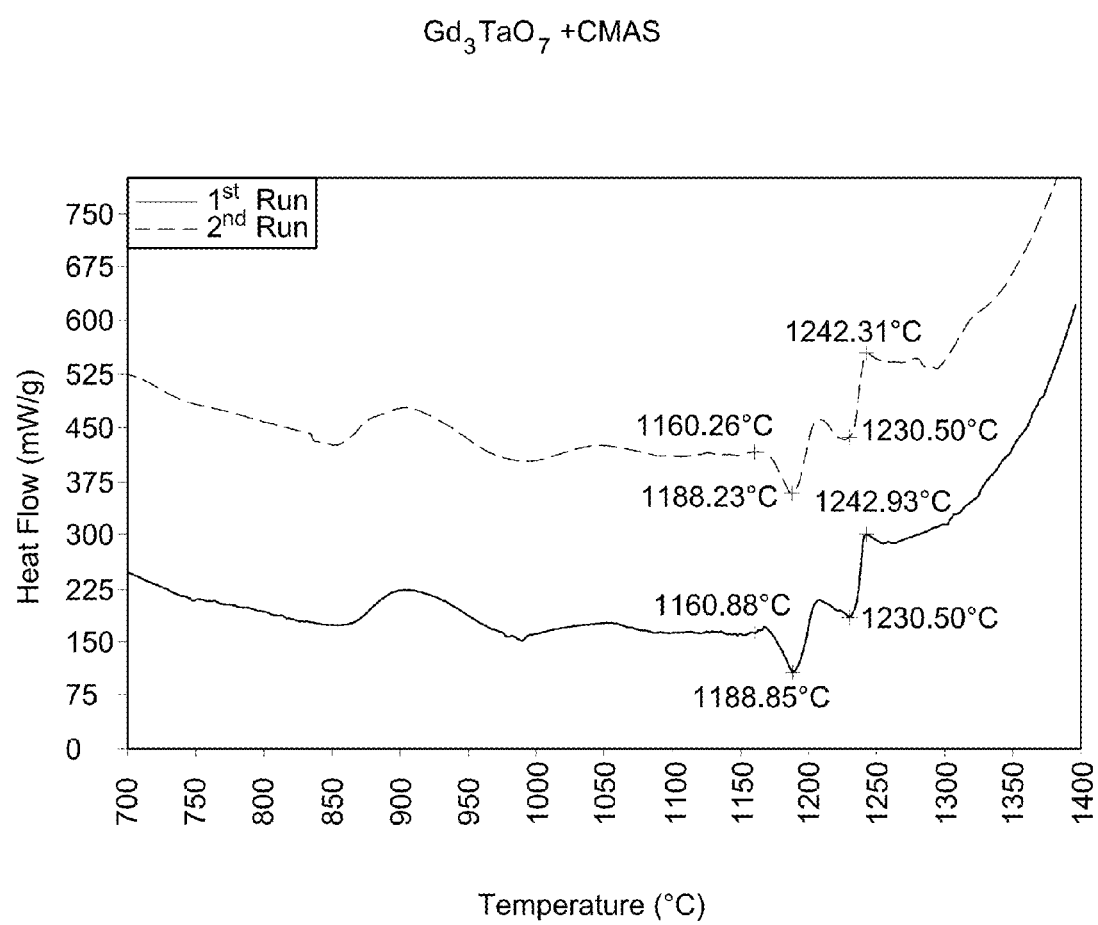
FIG. 9 shows the differential scanning calorimetry scans for reaction products of an orthorhombic weberite oxide with CMAS in accordance with an embodiment of the invention.

Differential Scanning Calorimetry (DSC) Measurements to Observe the Thermal Events During CMAS and Weberite Oxide Reactions DSC scans were conducted to observe the thermal events during reaction between CMAS and the weberite oxides. The DSC scans were conducted by heating 75 mg samples of $Gd_3NbO_7$ or $Gd_3TaO_7$ with CMAS (5:1 molar ratio) from room temperature to 1400° C. at 10° C./min in two runs. As shown in FIGS. 8 and 9, observation of exotherms during or immediately after CMAS melting indicates rapid reactivity to form a second product phase.

The present invention has been described in terms of some specific embodiments. They are intended for illustration only, and should not be construed as being limiting in any way. Thus, it should be understood that modifications can be made thereto, which are within the scope of the invention and the appended claims. Furthermore, all of the patents, patent applications, articles, and texts which are mentioned above are incorporated herein by reference.

The invention claimed is:

1. An article, comprising:
    a substrate; and
    a plurality of coatings disposed on the substrate, the plurality of coatings comprising:
        a thermal barrier coating disposed on the substrate; and
        a protective overlaying coating comprising a calcium-magnesium-aluminum-silicon-oxide (CMAS)-reactive material disposed on the thermal barrier coating, the CMAS-reactive material having a formula $Gd_3BO_7$ and an orthorhombic weberite crystal structure,
        wherein B is at least one element selected from the group consisting of tantalum and niobium and wherein the CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition, and wherein the CMAS-reactive material is present in the plurality of coatings in an amount in a range from about 10 volume percent to about 75 volume percent of the plurality of coatings.

2. The article of claim 1, wherein the protective coating has a thickness in a range from about 10 microns to about 1000 microns.

3. The article of claim 1, wherein the protective coating consists essentially of the CMAS-reactive material.

4. The article of claim 1, wherein the substrate comprises a superalloy material.

5. The article of claim 1, further comprising a bond coating disposed between the substrate and the thermal barrier coating.

6. A turbine engine component comprising the article of claim 1.

7. The turbine engine component of claim 6, wherein the article is a combustor component, a turbine blade, a shroud, a nozzle, a heat shield, or a vane.

8. The article of claim 1, wherein the protective coating has a thickness in a range from about 10 microns to about 1000 microns.

9. The article of claim 1, wherein the thermal barrier coating comprises yttria-stabilized zirconia, scandia-stabilized zirconia, hafnia-stabilized zirconia, calcia-stabilized zirconia, magnesia-stabilized zirconia, or combinations thereof.

10. The article of claim 1, wherein the CMAS-reactive material is present in the plurality of coatings in an amount in a range from about 10 volume percent to about 50 volume percent of the plurality of coatings.

11. The article of claim 1, wherein the thermal barrier coating has a thickness in a range from about 50% to about 90% of the total thickness of the plurality of layers.

* * * * *